United States Patent
Pannone (12)

(10) Patent No.: US 8,990,037 B2
(45) Date of Patent: Mar. 24, 2015

(54) RF POWER METER USING BRUENE-TYPE COUPLER

(76) Inventor: Louis V. Pannone, Manalapan, NJ (US)

( * ) Notice: Subject to any disclaimer, the term of this patent is extended or adjusted under 35 U.S.C. 154(b) by 424 days.

(21) Appl. No.: 13/456,816

(22) Filed: Apr. 26, 2012

(65) Prior Publication Data

US 2012/0278025 A1 Nov. 1, 2012

Related U.S. Application Data

(60) Provisional application No. 61/480,533, filed on Apr. 29, 2011.

(51) Int. Cl.
*G06F 19/00* (2011.01)
*G01R 21/00* (2006.01)
*G01R 21/01* (2006.01)

(52) U.S. Cl.
CPC .................................... *G01R 21/01* (2013.01)
USPC ............................... 702/61; 324/647; 702/60

(58) Field of Classification Search
CPC ........ G01R 21/00; G01R 21/01; G01R 21/12; G01R 21/133; G01R 35/005; G01R 21/10; G01R 27/32; G01R 33/288; G01R 33/3614
USPC ................... 702/60, 61, 66, 67, 75, 104, 106; 324/96, 647

See application file for complete search history.

(56) References Cited

U.S. PATENT DOCUMENTS 8,620,606 B2 * 12/2013 Holt ................................ 702/60
2014/0015547 A1 * 1/2014 Bottomley et al. ........... 324/647

OTHER PUBLICATIONS

Bruene, Warren B. "An Inside Picture of Directional Wattmeters", QST magazine, Apr. 1959, p. 24-28.

* cited by examiner

*Primary Examiner* — John H Le
(74) *Attorney, Agent, or Firm* — Brown & Michaels, PC

(57) ABSTRACT

A measurement system, for use in RF power measurements, allows an arbitrary Bruene-type RF coupler to be calibrated at a number of different power levels and frequencies with an idealized transfer function being created for each calibration power point. Following calibration, when the coupler is used in an operational (measurement) mode, the DC voltage corresponding to the present power measurement is read, and the discrete idealized transfer functions generated during the power and frequency calibration phases are used to determine a best fit idealized transfer function, which is used in conjunction with the exact DC voltage being measured to create a highly accurate power measurement.

19 Claims, 8 Drawing Sheets

RF POWER METER USING BRUENE-TYPE COUPLER

REFERENCE TO RELATED APPLICATIONS

This application claims one or more inventions which were disclosed in Provisional Application No. 61/480,533, filed Apr. 29, 2011, entitled "RF Power Meter that can accurately measure power using any Bruene-type coupler". The benefit under 35 USC §119(e) of the United States provisional application is hereby claimed, and the aforementioned application is hereby incorporated herein by reference.

BACKGROUND OF THE INVENTION

1. Field of the Invention

The invention pertains to the field of electrical measuring and testing. More particularly, the invention pertains to radio-frequency power measurement using directional couplers.

2. Description of Related Art

A form of directional coupler used in RF measurement is often described as a "Bruene Bridge" or "Bruene-type coupler", after the article "An Inside Picture of Directional Wattmeters", by Warren B Bruene, W5OLY, published in QST magazine on April 1959, p 24-28.

FIG. 8 shows Bruene's drawing of a directional wattmeter circuit from his 1959 QST article (also FIG. 8 in the article, page 27). The wattmeter 300 is made up of a directional coupler 301 and a control head 320. The two components might be integrated into a single case, or, often, are set up with the coupler 301 remote from the control head 320, linked by wires 323 and 324, bearing voltages representative of reflected power and forward power, respectively. A switch 321 allows the meter 322 to read either forward or reflected power, as desired.

As shown in FIG. 8, the coupler 301 is inserted into the feedline between the output of a transmitter 302 and the line to an antenna 303. The feedline is shown here schematically as a coaxial cable, with the shield 304 and 305 being grounded, and the center conductor 307 running continuously from transmitter 302 to antenna 303 lines through a toroid 306. The RF current I in the center conductor 307 is sampled by inductive coupling to toroid coil 306. The current I induces a voltage in coil 308 wrapped around the toroid 307, and as a result current i flows through the coil 308 and its series resistors R. The value of resistance R is kept small compared with the coil 308 reactance so it has little effect on coil current. The coil current i then is determined by the induced voltage $v_I$ across resistors R, and the resistance of coil 308.

Detector diodes 309 and 310 rectify the voltage to $e_v$ on each side of the coil 308, and, through chokes 311 and 312 and calibrating resistors 313 and 314, feed wires 323 and 324 through switch 321 to allow meter 322 to read reflected and forward power, respectively.

A problem of prior art measurement approaches is that accurate radio frequency (RF) power measurements require careful and complementary design and construction of both the coupler that is inserted in line with the transmission line on which measurements are to be performed and the control head, which processes DC output signals from the coupler to determine the power present on the transmission line and display the results to a user.

At low power levels, such couplers are typically problematic because of the voltage drop and nonlinearity of diode detectors typically used in Bruene-type couplers. At high power levels, problems can arise due to saturation of the toroid core typically used in couplers. Furthermore, couplers are generally not flat across the frequency spectrum, meaning that their voltage-to-power curve (also referred to as its transfer function) typically varies, and is not equal level for a given incident power when the operating band (frequency) is changed, as is typically encountered when performing power measurements in Amateur Radio and other applications.

SUMMARY OF THE INVENTION

The invention presents a radio frequency power meter using Bruene-type directional couplers. A high level of accuracy is accomplished using such couplers, through use of a novel multipoint calibration method. The coupler curve is characterized at several discrete power calibration points, and piecewise ideal transfer functions of the coupler are created within the operating region of these multiple calibration points.

The present invention allows a Bruene-type coupler that produces a DC output voltage to be calibrated using a precision measurement device (PMD) as the measurement reference. Calibration using the PMD is performed across both a wide power and frequency range, resulting in high accuracy measurements, whose accuracy is limited only by the accuracy of the PMD.

DETAILED DESCRIPTION OF THE INVENTION

Figure 1:
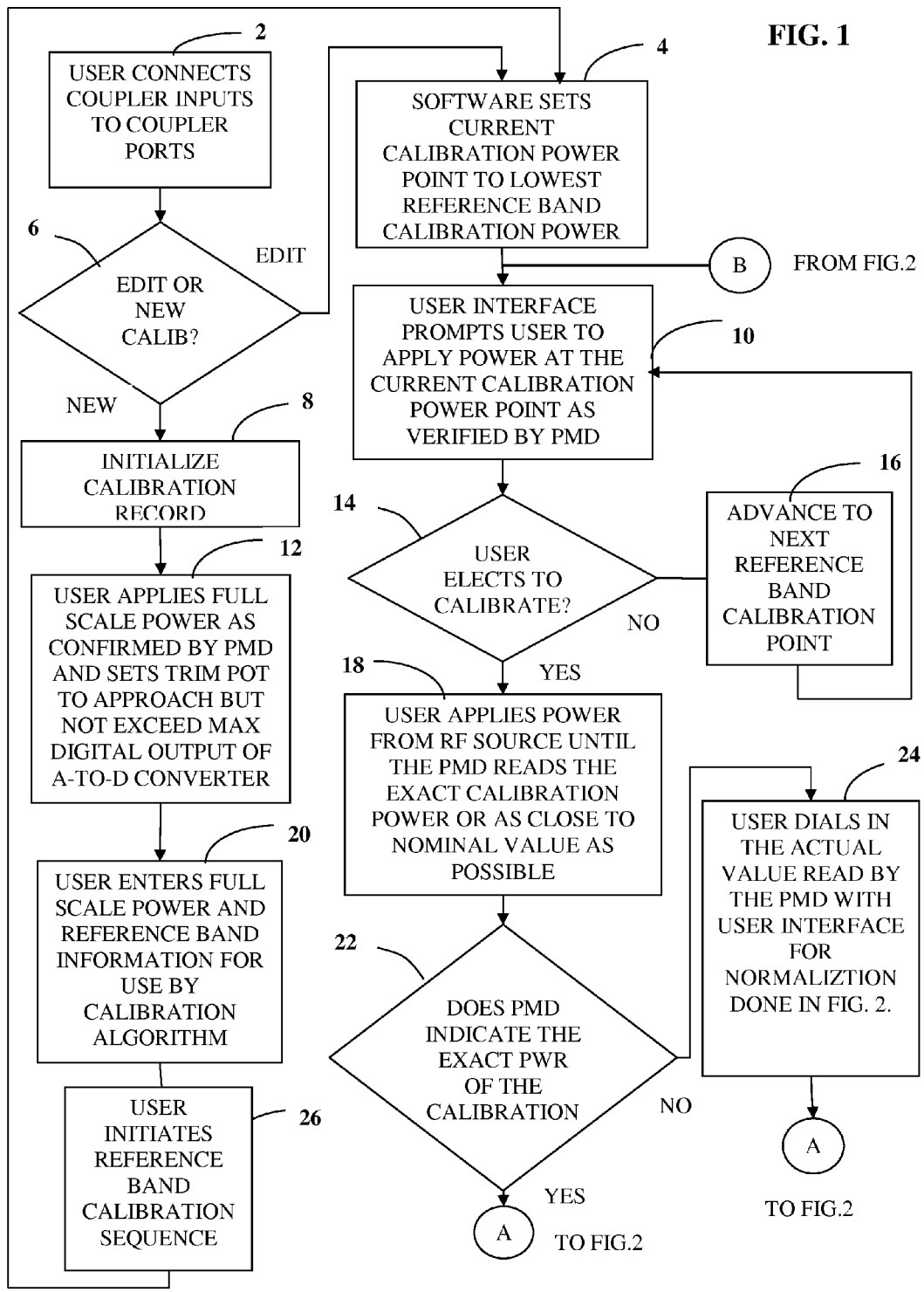
FIGS. 1 and 2 together show a flowchart of the Reference Band Calibration procedure of the invention.

The ability of this invention to utilize an arbitrary Bruene-type coupler, and to achieve a high level of accuracy using such couplers, is accomplished through use of a novel multipoint calibration method. Once calibrated, the arbitrary coupler, in combination with this invention, shall be referred to as an RF power meter.

This invention characterizes the coupler curve, also known as its transfer function, which is a characterization of the DC output voltage produced by the coupler as a function of incident power, at several discrete power calibration points. By calibrating the coupler at multiple points, the typical problem of the coupler not being ideal and therefore, not following the well known square law relationship between the power being measured by the coupler and the voltage generated by the coupler, which applies for ideal couplers only, is addressed. This is done by creating piecewise ideal transfer functions of the coupler within the operating region of these multiple calibration points.

By providing a method to idealize the power/voltage curve for each instantaneous measurement made in the operational mode (vs. calibration mode) mode, the end result is that the accuracy of each measurement approaches that of an ideal coupler that has an ideal square law relationship between power and generated voltage, and that is flat across the frequency range.

After calibration, when the meter is being used to perform measurements in a normal (operational) mode, if a measurement is subsequently performed at the same frequency and power level as any of the previously saved calibration points, the data for that calibration point will allow the software to calculate an accurate power reading with minimal error to within the precision of the PMD. However, since the power encountered in real world situations is a continuously variable function, the likelihood of an incident power level exactly matching a previous calibration point is extremely low.

To deal with this predominant case in which the power being measured does not have an exact match with any of the previously saved calibration points, the ideal set of transfer functions associated with each of the previously acquired calibration points is used to create an optimized transfer function for the current measurement condition, thereby closely approximating an idealized transfer function for the incident power.

If the current measurement is bounded by two of the available calibration points, the transfer functions of these bounded points are used to generate a transfer function for the current measurement that is better estimate of the idealized transfer function than the transfer functions of either of the two bounding calibration points. If the current measurement is lower or higher than the lowest or highest available calibration points, the idealized transfer function associated with the lowest or highest power calibration is used respectively.

The above process is repeated for every measurement processed by this invention. Thus, an arbitrarily large number of optimized transfer functions will typically be calculated and used during a measurement session, which will typically consist of several million measurements.

FIGS. 1 to 5 show flowcharts of the preferred logic and chronological order of calibration and measurement processing.

Figure 4:
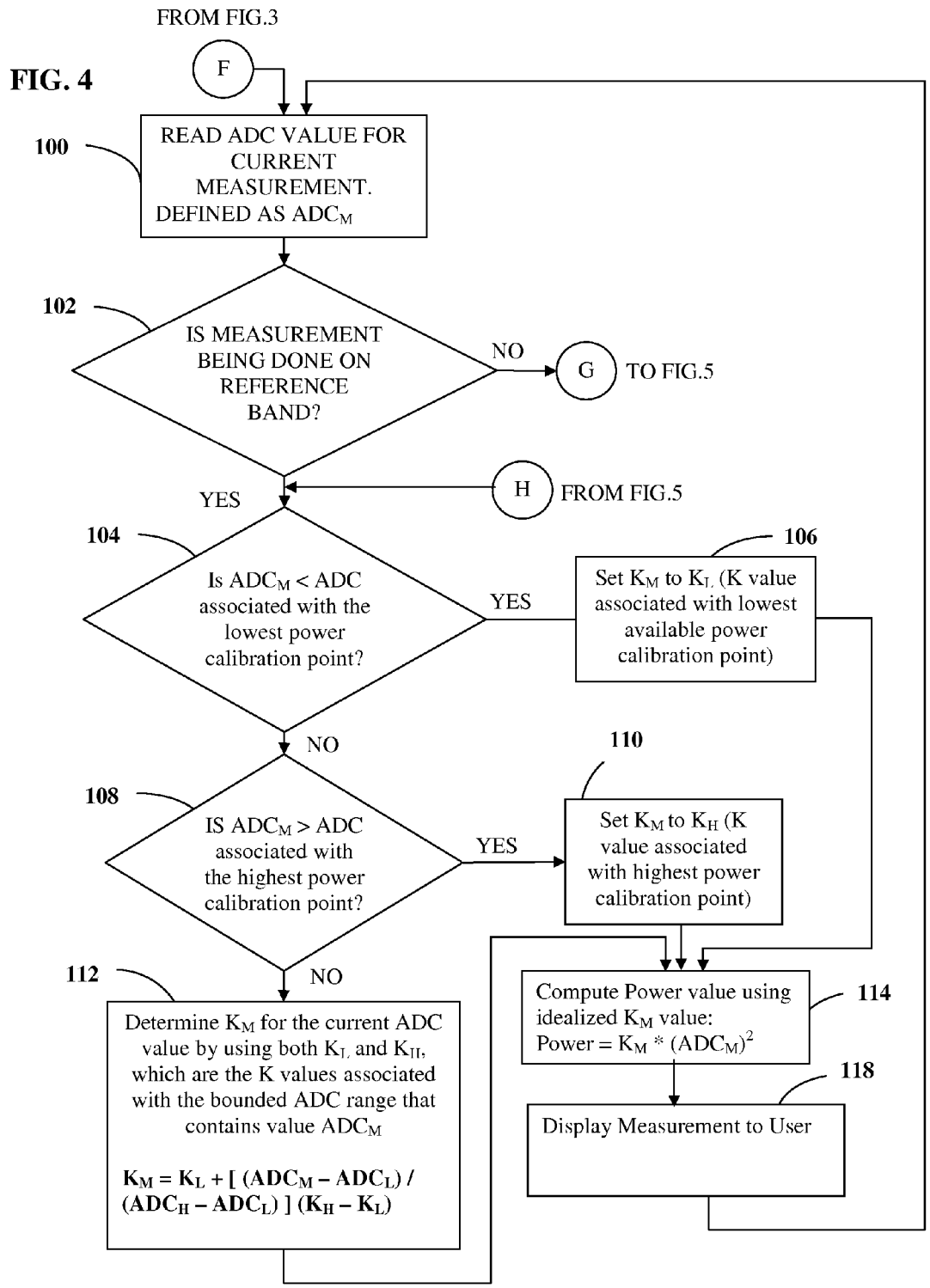
FIG. 4 shows a flowchart of a method of Measurement Processing according to the invention, when Band Correction is not used.

Referring now to FIG. 1 as well as FIG. 4, the process preferably begins at the step of Connection 2 and ends at the step of Non-Reference Band Measurements 118. However, the order of many of these steps may be changed. By way of example but not limitation, the steps of performing Reference Band measurements 100-118 in FIG. 4 may occur prior to, and without the need to do the steps of band correction 120-132 shown in FIG. 5.

Operation of this invention is best explained by dividing the description into two parts: the calibration of the RF power meter, and the actual meter measurement, which makes use of the calibration data.

Both the calibration and measurement phases can be further subdivided into two categories, namely calibration performed on the Reference Band and non-Reference Bands, and measurements performed on the Reference Band and non-Reference Bands. A definition of these terms is given below.

The Amateur Radio Bands cover a number of bands of frequencies, by tradition identified by an approximate wavelength—for example, the band between 14.0 and 14.35 MHz is usually termed the "twenty meter band". Each band corresponds to a well defined and limited range of frequencies on which operation in the Amateur Radio service can be conducted under national laws and international treaties. The most commonly used Amateur Radio bands range from the 160 meter wavelength (1.8 to 2.0 MHz) to the 70 centimeter wavelength (420-450 MHz), and there are less-frequently used bands even higher in the radio spectrum into the microwave range.

Bruene-type couplers are typically designed to operate over a limited range of frequencies. For example, a given Bruene-type coupler may cover the High Frequency (HF) band segment, which covers the bands ranging from 160 meters to 10 meters, but may not be useable at higher bands such as the Very High Frequency (VHF) of 6 meter, 2 meter or 1.25 meter bands, or the Ultra High Frequency (UHF) of 70 cm and higher bands.

Accurate calibration of a coupler on one of these bands, for example the 160 meter band (1.8-2.0 MHz), will result in accurate measurements when the radio equipment is operated on that band. But when that coupler is used on another band, for example the 10 meter band (28-30 MHz), the accuracy that was achieved on the band that the coupler was calibrated on, 160 meters in this example, will not be realized on the 10 meter band.

This is because the coupler characteristics are not flat across frequency. Operation at a frequency other than the one the coupler was calibrated at will result in the coupler being either more sensitive or less sensitive than at the calibration band, resulting in either a larger or smaller DC voltage output respectively from the coupler at a given power level, compared to the band the coupler was calibrated at. With respect to how this relates to this invention, we will refer to the band at which the coupler was calibrated as the "Reference Band". We will refer to the other bands as "non-Reference Bands".

This invention allows accurate measurements to be performed on both the Reference and non-Reference Bands. This is accomplished by generating a large number of idealized coupler transfer functions on the Reference Band by performing the Reference Band calibration at a number of different power levels (typically 60 power points, although a larger or smaller number will suffice depending upon the coupler). The power levels selected for calibration should encompass the range of powers the coupler is intended to be used at. Each calibration point allows an ideal transfer function to be calculated for the coupler for the exact power the calibration is performed at. When a power level is being measured that does not correspond to an exact calibration point, the calibration points closest to the incident power being measured are used to generate an optimized transfer function that is capable of generating a highly accurate measurement.

To deal with the non-Reference Band measurements, a band correction algorithm is incorporated that will typically be done at a much smaller number of power points than for the Reference Band. This step, referred to as Band Correction, characterizes the ratio of the coupler's DC output on the non-Reference Bands with respect the coupler's DC output on the Reference Band for a given power level.

When measurements are performed operationally on the Reference Band, only the Reference Band calibration data is used. When measurements are performed operationally on non-Reference Bands, both the band correction factors generated during generation of the non-Reference Band correction factors, as well as the Reference Band calibration data, are used to accurately calculate power measurements as described below.

While the Reference Band may be calibrated at up to 60 points (as used in the example figures below), a smaller number of calibration points will also provide good results Likewise, while band correction may be performed at up to nine power levels per band (as used in the example figures below), a smaller number will provide good results.

If the PMD indicates the need for accuracy to be improved in a given power or frequency range after the initial calibration is complete, an EDIT function can be provided to allow the calibration tables to be augmented with additional calibration points and band correction factors without requiring the entire calibration process to be repeated.

Since Reference Band calibration and Band Correction are both calibration operations, to differentiate between the two, the term "calibration point" will be used to refer to the data points used to characterize the coupler transfer function on the Reference Band. The term "band correction points" will be used to refer to the data points used to characterize the coupler transfer function deviation on bands other than the Reference Band with respect to the Reference Band.

Figure 6:
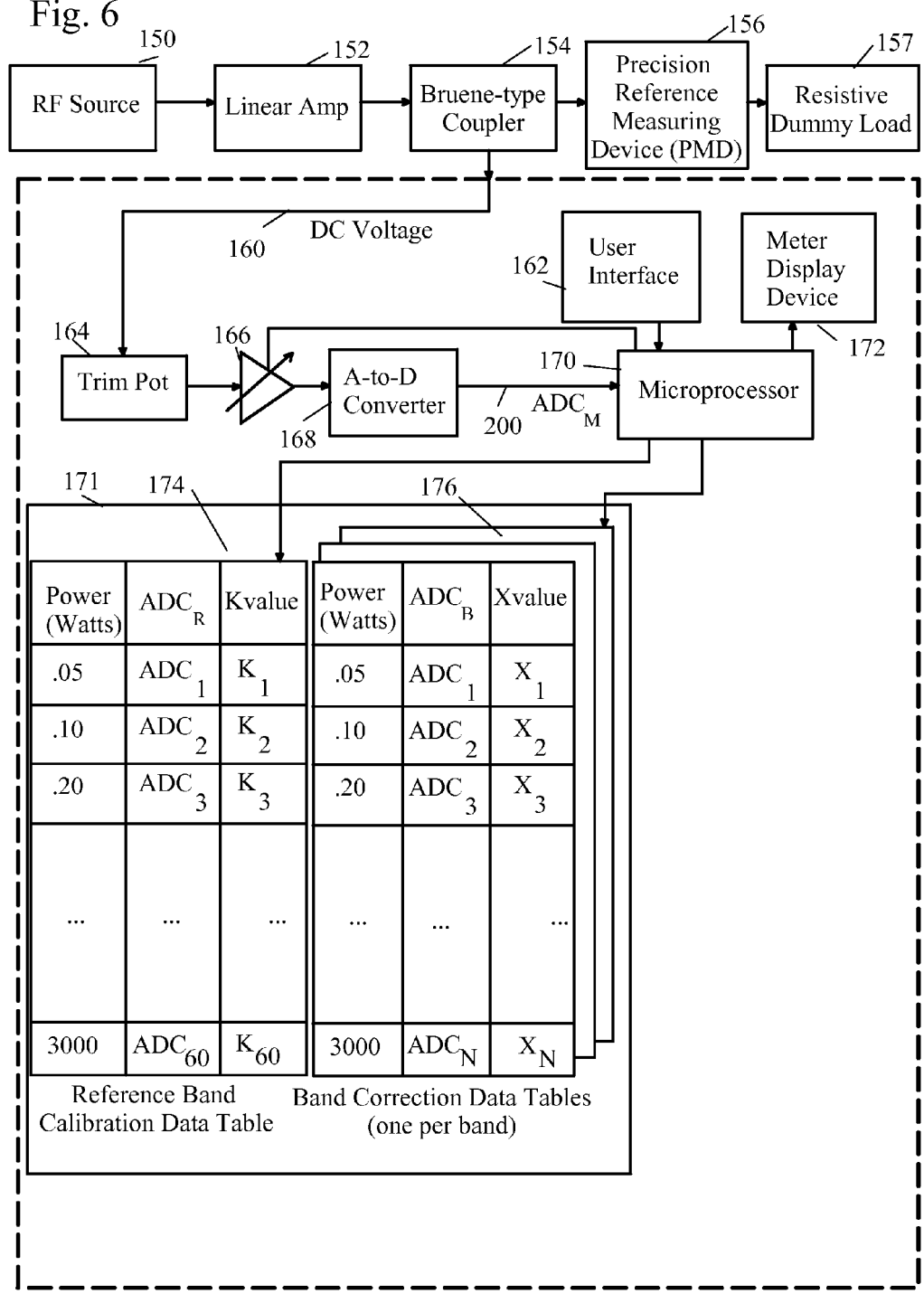
FIG. 6 shows a block diagram showing generation of the Calibration Tables.

FIG. 6 Calibration—Overview—Both Reference Band and Non-Reference Band

A block diagram of the calibration procedure for Reference Band calibration and generation of band correction factors of the non-Reference Bands is shown in FIG. 6. Items outside of the dashed line are not part of the invention.

Referring to FIG. 6, to perform calibration, an RF source 150 is used to produce signals of varying power and frequency. Depending on the power range at which the meter is to be operated, a linear amplifier 152 may be used to boost the power to higher levels. The output from the linear amplifier 152 is applied to the Bruene-type coupler 154 to be calibrated as part of this invention. A PMD 156 is inserted in tandem with the Bruene-type coupler 154. The PMD 156 is used to accurately set the power levels of RF source 150 during calibration. The output of the PMD is terminated in a resistive dummy load 157, preferably a 50 ohm load, which matches the 50 ohm characteristic impedance that is the default standard used in Amateur Radio and other services, although other values could be used within the teaching of the invention, depending on the intended application for the meter.

Because of the large range of coupler types used in the commercial and Amateur Radio applications, and the large variety of power ranges supported by this invention (preferably 0.05 watts to 30,000 watts, although other ranges are possible), the range of the DC output voltages 160 generated by the Bruene-type coupler 154 can be expected to vary considerably in magnitude and range from coupler to coupler. Thus a scaling stage in the form of a trim pot 164 and DC amplifier 166 are preferably used so that the voltage delivered to the input of the Analog-to-Digital (A-to-D) Converter 168 can be maximized without overshoot or overload. This allows the software to realize the maximum resolution for a given coupler for a given maximum (full scale) power range and its associated DC output voltage. It will be understood that this technique is given as an example, and other techniques are possible within the teachings of the invention.

The output of the A-to-D converter 168 is applied to a microprocessor 170, which implements all of the control logic and measurement algorithms. The microprocessor 170 drives a meter display device 172, which displays the measurements. The DC amplifier 166 is adjusted dynamically under software control of the microprocessor 170 to maximize the input to the A-to-D converter 168 without overdriving it based on the instantaneous value of the DC voltage 160 applied from the Bruene-type coupler 154.

A user interface 162 is used to communicate with the microprocessor 170 for purposes of sequencing through the calibration steps as well as for interfacing with the user when the meter is used in the operational mode.

During calibration, the Reference Band calibration data is stored in the Reference Band Calibration Data Table 174 in memory 171. The memory 171 is preferably a nonvolatile memory such as an electrically-erasable programmable read-only-memory (eeprom), but could be some other kind known to the art, such as, for example, a low-power drain volatile memory with a backup battery. Choosing a nonvolatile type of memory for memory 171 allows the Reference Band Calibration Data Table 174 and Band Correction Data Table 176 (described below) to be retrieved each time the meter is used, so that the calibration procedure is required only once, and not each time the meter is to be used.

Likewise, the band correction data for the non-Reference Bands are stored in the Band Correction Data Table 176 stored in memory 171. There is one instance of the Reference Band Calibration Data Table 174. There is one instance of the Band Correction Data Table 176 for each non-Reference Band for which band correction factors are generated. Thirteen instances would be a typical number to cover all popular Amateur Radio Bands from 160 meters through 70 centimeters, recognizing that a Band Correction Data Table 176 is not required for the Reference Band.

Figure 7:
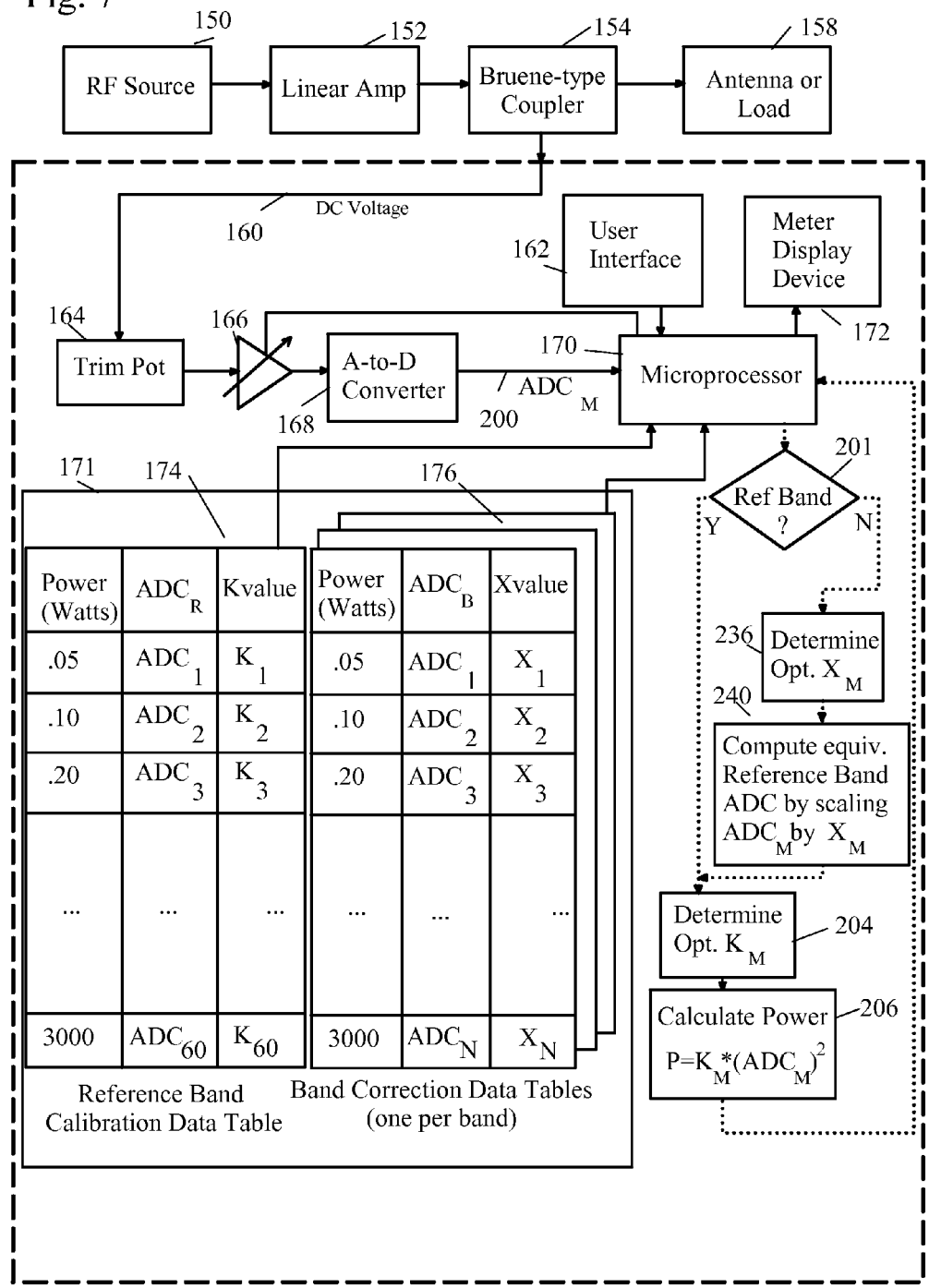
FIG. 7 shows a block diagram showing processing of measurements.
Figure 8:
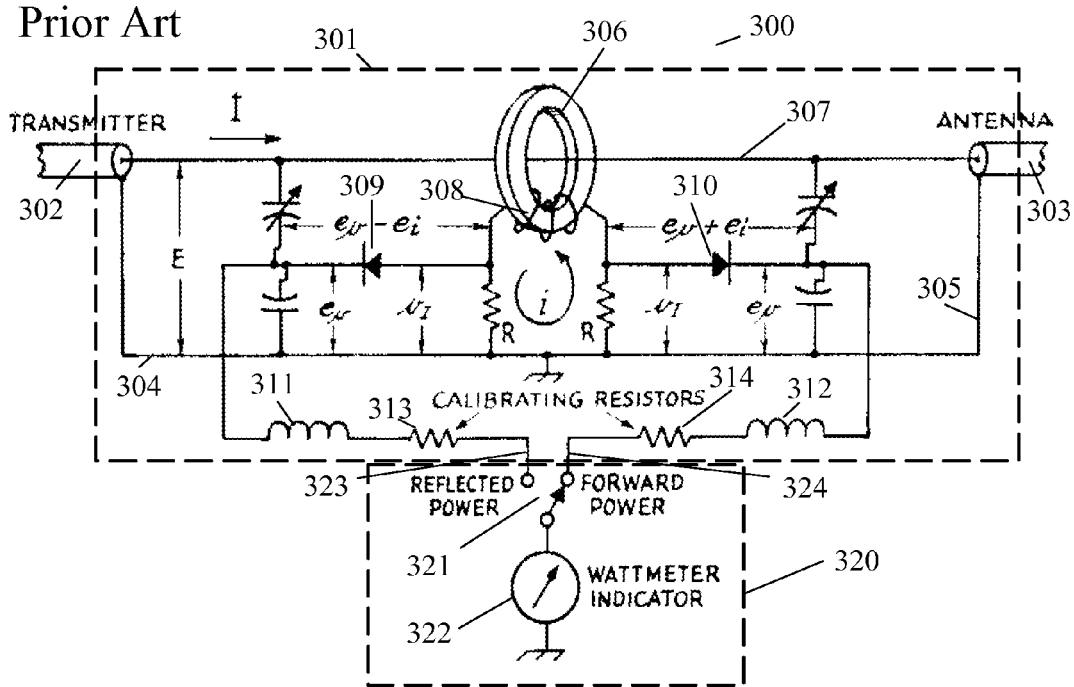
FIG. 8 is a prior art figure showing a Bruene-type coupler and associated meter.

FIG. 7 Overview—Measurements

A block diagram of the measurement process for performing measurements using the invention is shown in FIG. 7. The items outside of the dashed line are not part of the invention. Many of the elements are the same as those described in FIG. 6. This discussion assumes that the calibration operations described for FIG. 6 have already been performed.

To use the meter of the invention to measure power, the output from an RF source 150 is applied to the Bruene-type coupler 154 that has been previously calibrated. The output of the Bruene-type coupler 154 is terminated into a 50 ohm resistive dummy load or antenna 158, the latter being the configuration used for actual transmission of the RF power. Should the user require more power than the RF source 150 can generate, an optional linear amplifier 152 can be used between the RF source 150 and the Bruene-type coupler 154, in which case, the meter is measuring the amplified signal of the linear amplifier 152.

Measurements on the Reference Band

Referring to FIG. 7, if the meter of the invention determines 201 that the measurement is to be performed on the Reference Band, whether by actual measurement of the RF signal or in response to a user input on the user interface 162, the microprocessor will be programmed to follow the method described in this section.

The D.C. output voltage 160 generated by the Bruene-type coupler 154 is applied to a trim pot 164 before being applied to the input of DC amplifier 166. The trim pot 164 has been previously adjusted during the Reference Band calibration phase described in FIG. 6 and does not require further adjustment. The DC amplifier 166 controls the level of the input to the A-to-D converter 168 to maximize the input level seen by the A-to-D converter 168 without overdriving it.

To process a given measurement, the current ADC value is obtained on the output 200 of A-to-D converter 168 and processed by microprocessor 170. This measured ADC value is referred to as $ADC_M$ in this description. Microprocessor 170 uses that $ADC_M$ value in conjunction with the previously created Reference Band Calibration Data Table 174, to determine the optimized constant of proportionality $K_M$ in step 204. Once the optimized constant of proportionality $K_M$ is determined in step 204, it is used in conjunction with ADC value $ADC_M$. Using the well known square law voltage to power relationship for an ideal coupler, $P=K_M*(ADC_M)^2$ the incident power P is calculated as shown in 206.

The power measurement value is then output to meter display device 172.

Measurements on a Non-Reference Band

Non-Reference Band measurements are processed identically to that previously described for Reference Band measurements, up to decision block 201.

If the meter of the invention determines 201 that the measurement is to be performed on a Non-Reference Band, whether by actual measurement of the frequency of the RF signal or in response to a user input on the user interface 162, then microprocessor 170 will be programmed in step 236 to determine an optimized band correction factor $X_M$ by reference to the Band Correction Data Table 176 for the appropriate band on which the signal to be measured is generated. Then, in step 240, microprocessor 170 uses $ADC_M$ and band correction factor $X_M$ to produce a scaled $ADC_M$ value that is normalized to the Reference Band Calibration Data Table 174.

The microprocessor 170 then proceeds in step 204 to determine the optimal $K_M$, calculates the incident power P in step 206, and displays the power measurement value on the meter display device 172, as with the Reference Band measurements described above.

Figure 2:
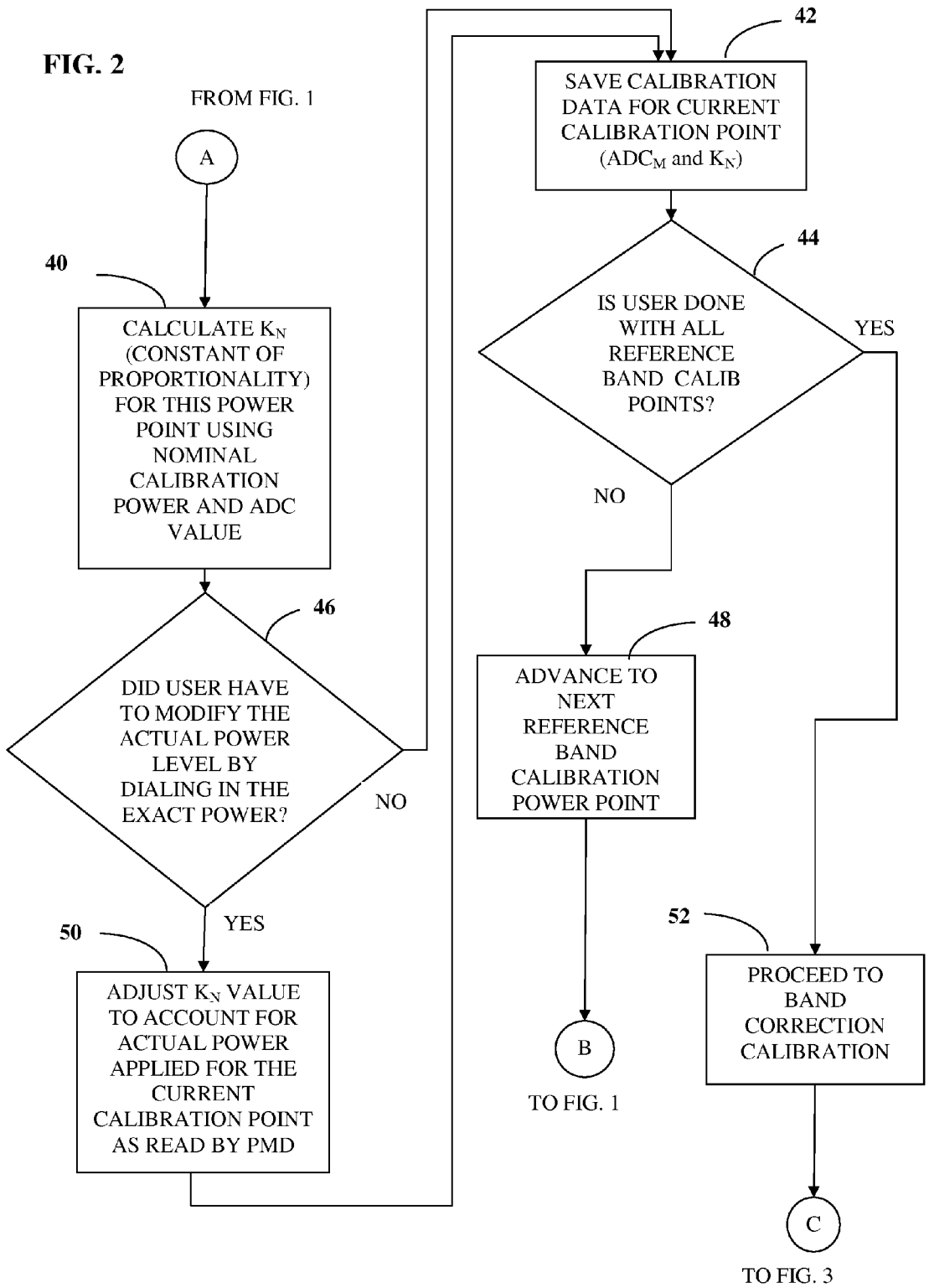

Reference Band Calibration—Flowcharts FIGS. 1 and 2

To understand how the calibration data is processed, it is first necessary to understand how the calibration data will be used when the invention is being used operationally to perform power measurements.

For an ideal coupler, the transfer function is given by:

$$P=K*V^2$$

where V is the DC voltage generated by the coupler for a given power level, and K is the constant of proportionality that will vary from coupler to coupler, but is constant for an ideal coupler (in that it is not a function of the power or frequency at which the coupler is being operating).

For each power level on the Reference Band where this calibration is performed, a unique constant of proportionality, referred to as a K value, is calculated using the above formula, where P is the nominal power for each calibration point, and V is directly proportional to the ADC value measured at the output 200 of the A-to-D converter 168 at that calibration point. Since real couplers are not ideal, the computed K value will differ for each calibration point.

After calibration is complete, and while performing actual measurements, the uniquely calculated K value entry from the Reference Band Calibration Data Table 174 for a single calibration point would be used if the incident DC voltage from the coupler matched exactly the voltage corresponding to the ADC value entry from the Reference Band Calibration Data Table 174 corresponding to one of the previous calibration points. However, the probability of a given power measurement coinciding exactly with one of the discrete calibration points is very low. If an exact match is not found, the ADC values of all available calibration points that were saved in Reference Band Calibration Table 174 are consulted by the software. Typically, the voltage produced by a coupler for any given measurement will fall between two adjacent calibration points (of the maximum of 60 points) with each calibration point having its own constant of proportionality ($K_N$).

In this case, we would have two K values, for example, $K_L$, associated with the lower power calibration point of the bounded range, and $K_H$, associated with the higher power value calibration point of the bounded range. Each of these calibration points also has an ADC value associated with it, which is the output read from the A-to-D converter by the software for that calibration point.

$ADC_L$ is associated with the lower power calibration point that bounds the current ADC measurement, and $ADC_H$, associated with the higher power calibration point that bounds the current ADC measurement. If we define the ADC value for a particular measurement falling between $ADC_L$ and $ADC_H$ is $ADC_M$, a new transfer function can be calculated using the current $ADC_M$ value using linear interpolation as shown below to calculate a new constant of proportionality ($K_M$) that will provide a more accurate measurement than either constant of proportionality $K_L$ or $K_H$, namely:

$$K_M=K_L+[(ADC_M-ADC_L)/(ADC_H-ADC_L)]*(K_H-K_L)$$

Once this optimized value of $K_M$ has been determined, the software can then calculate the power of the incident signal using the following formula:

$$P=K_M*ADC_M^2$$

Should the measured ADC value be lower than the ADC value associated with the lowest available power calibration point, or should the measured ADC value be higher than the ADC value associated with the highest available power calibration point, the software will use the $K_L$ or $K_H$ respectively to calculate the power, where in this case $K_L$ corresponds to the constant of proportionality of the lowest power calibration point where calibration was performed, and where $K_H$ corresponds to the constant of proportionality of the highest power calibration point where calibration was performed.

The above addresses measurements performed on the Reference Band. To account for the fact that real world couplers are not flat across the frequency spectrum, this invention allows the user to perform calibration on each of the Amateur Radio bands of interest and uses that data, in conjunction with the Reference Band calibration data described above, so that the coupler can generate accurate measurements as a function of both power and frequency when measurements are being performed on a band other than the Reference Band.

With the above background, referring to FIG. 1, to perform the calibration, the user first connects the coupler DC output to the inputs and scaling circuitry as shown in step 2. The user then indicates in step 6 whether this operation is an initial calibration or an edit operation, where an edit operation is defined as a modification to the calibration data for a coupler that has been previously calibrated. If this is an initial calibration, the calibration record that holds a temporary snapshot of the calibration data is initialized as shown in step 8. Using an RF source 150 such as an Amateur Radio transmitter, the user then applies the maximum power that the coupler is to be calibrated at, as determined by the PMD 156, as shown in step 12. The user then adjusts a trim pot 164 that controls the amount of input voltage from the coupler that is applied to the Analog to Digital (A-to-D) converter 168 so that the maximum reading of the A-to-D converter is approached but not exceeded. This provides maximum resolution.

As shown in step 20, the user then enters the full scale power and Reference Band information using the user interface 162. This data will be used in the Calibration Procedure Algorithm described below.

The user then requests, via the user interface 162 to proceed with the calibration as shown in step 26, which causes the process to proceed to step 4, which prompts the user to commence calibration at the lowest available calibration power point.

Rather than performing a new calibration from scratch, it is also possible for a user to request a modification of a previous calibration, for purposes of modifying the calibration data associated with just a subset of the calibration data, thus permitting the calibration to be updated without requiring the entire calibration process to be repeated. The request to perform an EDIT operation, as made by the user, is shown in 6, which causes the process to proceed to 4, just as with a new calibration. As can be seen in FIG. 1, this path, which is taken when an EDIT operation is requested, prevents the erasure of the calibration record as shown in step 8, thereby allowing the user to modify only the calibration points requiring correction or augmentation, while maintaining the previously acquired calibration points.

The process then iterates for each calibration point, and the calibration procedure described below ensues for each calibration point.

Regardless of whether the calibration is a new calibration or an EDIT of a previous calibration, the user is prompted for each calibration power point and given the option to perform calibration at that power level or to skip that power level and proceed to the next higher power level. It should be noted that excellent accuracy can be achieved with only a subset of the possible maximum number of 60 calibration points because of the interpolation steps used in measurement algorithm shown at 112 in FIG. 4.

If the user opts to skip the current calibration power point in step 14, step 16 and step 10 the process advances to the next higher calibration power level and the user is again offered the option to calibrate the next power point or to skip it and proceed to the next calibration point.

For each Reference Band calibration point selected by the user for calibration, the software instructs the user to apply the nominal power of the current calibration point as shown in step 18. The RF source 150 is adjusted until the PMD 156 reads the power corresponding to the current calibration point or to the closest obtainable power given the granularity of RF source 150.

Since it may be difficult, under some circumstances, to apply the exact power corresponding to the power level of the current calibration point due to limitations on the granularity of RF output controls of RF source 150, which is typically a transmitter or transceiver, step 22 allows the user to indicate, via the user interface 162, whether the PMD 156 indicates that the current power being applied is exactly equal to the nominal calibration power, to within the resolution of the PMD 156. If not, the user enters in the exact power being applied, as measured on the PMD 156, as shown in step 24. This is done by having the user read the exact power being applied, as measured on the PMD 156, and then entering that power level, via the user interface 162, so that the exact calibration power level is accessible to the microprocessor 170. The software then extrapolates what the constant of proportionality between the measured ADC value and nominal calibration power level would have been if exactly the nominal calibration power level was being applied. The extrapolation makes use of the well known square law voltage to power relationship for an ideal coupler, and can safely assume an idealized curve in the range of the target calibration point and the actual measured power since the two values are very close to each other. This constraint is imposed by the user interface 162.

The constant of proportionality, referred to as $K_N$, is then calculated, as described below:

Referring now to FIG. 2, step 40, for calibration power point $P_N$, the constant of proportionality $K_N$ is calculated using the following formula, which is equivalent to the well known square law relationship between the power being measured by the coupler and the ADC value corresponding to the voltage generated by the coupler:

$$K_N = P_N / ADC_M^2$$

where $P_N$ is the power level of the current calibration point, $ADC_M$ is the measured ADC value at this power level, and $K_N$ is the calculated constant of proportionality.

If the user had to specify the actual value of the applied power in step 24 in FIG. 1, the YES decision path of step 46 FIG. 2, and step 50 FIG. 2 are processed to extrapolate what the $K_N$ value would have been if exactly the nominal calibration power level was being applied. The extrapolation makes use of the well known square law voltage to power relationship for an ideal coupler and can safely assume an idealized curve in the range of the target calibration point and the actual measured power since the two values are very close to each other. This constraint that the actual measured power must be close to the nominal calibration power is imposed by the user interface 162.

The ADC value, $ADC_M$, and the calculated constant of proportionality, $K_N$, for the current calibration point are saved in the Reference Band Calibration Data Table 174 in the row corresponding to the power level of the current calibration point, as shown in step 42.

The calibration software checks 44 if the current calibration point is the last calibration point required for this calibration procedure. If there are more points to calibrate, the next calibration point is selected as shown in step 48, and the process repeats at step 10 in FIG. 1, where the user is directed by user interface 162 to apply power at the new calibration power level as determined by the PMD 156, thereby repeating the steps described above for the first calibration point.

This procedure of prompting the user for a calibration point, instructing the user to apply the corresponding power, and processing the calibration data is repeated for a maximum of 60 different power calibration points, although a smaller or larger number of calibration points could be used within the teaching of the invention.

When all calibration points are processed, the "NO" decision path in step 44 is traversed, which results in the process progressing to the Band calibration phase as shown in step 52.

Figure 3:
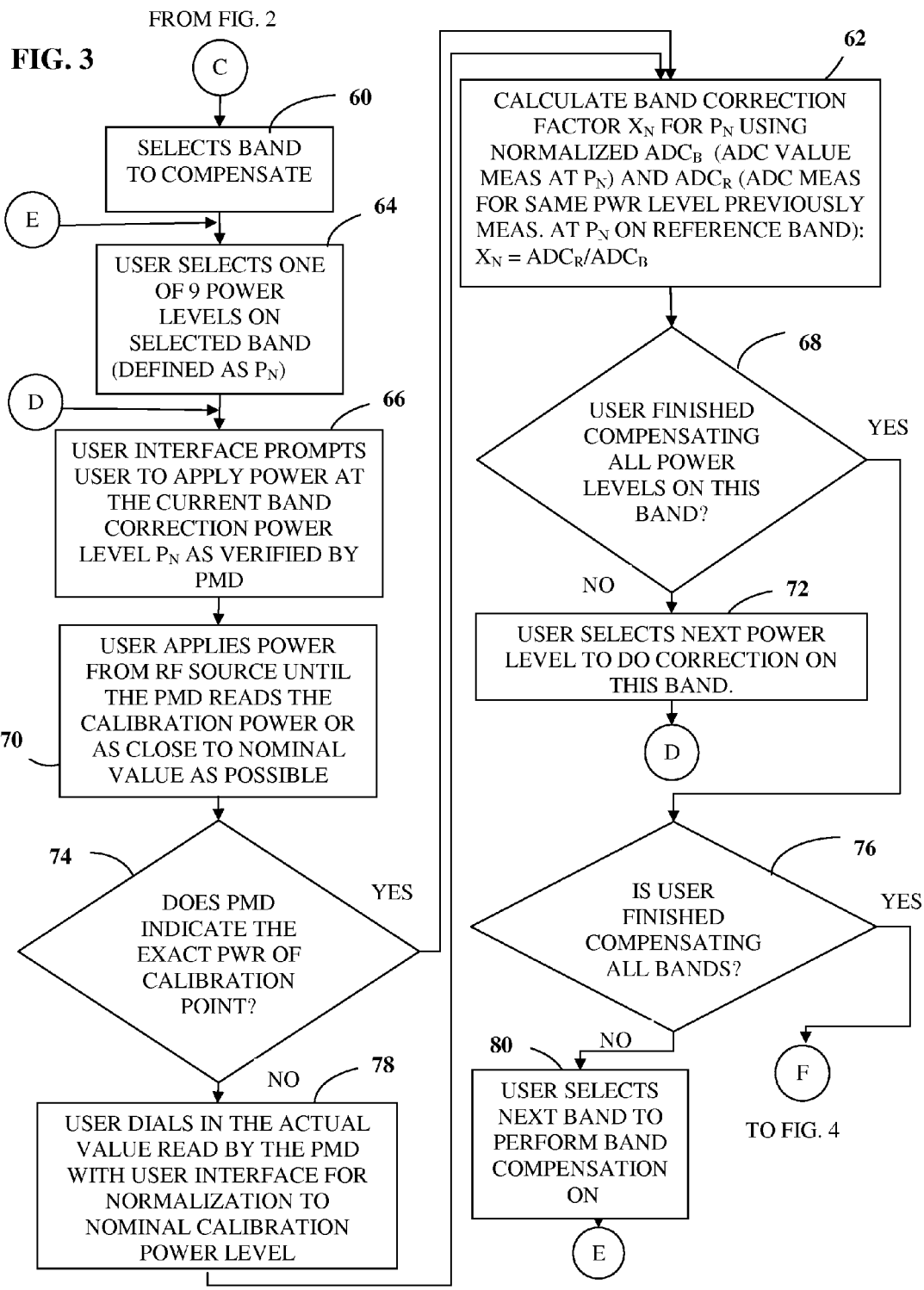
FIG. 3 shows a flowchart of the Band Correction Calibration procedure of the invention.

Non-Reference Band Calibration Flowchart—FIG. 3

Referring to FIG. 3, to generate the band correction factors for non-Reference Bands, the user sets the frequency of the RF source 150 to the frequency corresponding to the band to be band corrected. Using the user interface 162, the user then notifies the software of the band that is being calibrated as shown in step 60. Using the user interface 162, the user then notifies the software as to which of the power levels band correction is being performed at on the current band as shown in step 64. Preferably, up to nine power levels would be used for creating each instance of a Band Correction Data Table 176, and the example below refers to "nine" levels, but it will be understood that more or fewer levels could be provided as desired.

In step 66, the software prompts the user to apply the selected power at one of the nine available power levels for band correction, as chosen in step 64.

The user then applies power at a level as close to the nominal band correction power level as possible as shown in step 70, and the actual power being applied is determined by the PMD 156.

Of the nine power levels available for band correction on each band, the actual power levels selected by the user for band correction must match power levels where calibration was performed on the Reference Band and stored in the Reference Band Calibration Data Table 174. The reason for this is that the basis for band correction is determination of the ratio of the coupler's DC output on the non-Reference Bands with respect the coupler's DC output on the Reference Band for a given power level. Thus, all power levels used for band correction must have corresponding calibration points for those power levels on the Reference Band.

The RF source 150 is adjusted until the PMD 156 reads, as closely as practicable, the selected power. Since it may be difficult, under some circumstances, to apply the exact power corresponding to the current calibration power due to limitations on the granularity of RF output controls of the RF source, which is typically a transmitter or transceiver, the software and user interface 162, via steps 74 and 78, allow the user to dial in the power being applied, as measured on the PMD 156.

This is done by reading the exact power on the PMD 156 and entering that power level, via the user interface 162, to the software running on the microprocessor 170, which then extrapolates what the band correction factor $X_N$, would have been if exactly the nominal calibration power level was being applied. The extrapolation makes use of the well known square law voltage to power relationship for an ideal coupler and can safely assume an idealized curve in the range of the target calibration point and the actual measured power since the two values are very close to each other. This constraint that the actual measured power must be close to the nominal calibration power is imposed by the user interface 162.

The band correction factor, $X_N$, is then calculated, as shown in step 62 where $ADC_B$ is the ADC value measured on the band being corrected, and $ADC_R$ is the ADC value that was measured at the same power level on the Reference Band. The calculated band correction factor $X_N$ is then saved in the corresponding row in the Band Correction Data Table 176.

The decision block step 68 checks if the current calibration point is the last of the nine available power levels required for band correction. If there are more points to perform band correction on, the next power level is selected by the user as shown in step 72. The process then proceeds to step 66, where the user is directed to apply power at the new power level. This sequence repeats until all power levels for the current band are processed, at which point step 76 is entered.

Although there are multiple amateur radio bands, and other services have varying numbers of bands, the user has the option of performing band correction on some, all, or no non-Reference Bands. Of course, the Reference Band calibration described in FIGS. 1, 2 and 6 must be performed to provide the minimal calibration for the method.

The user is asked, in step 76, whether he or she is finished with band correction, or if correction on another band is desired. If the user desires to perform band correction on another non-Reference Band, step 80 is processed and requests the user to input, via the user interface 162, the next band to be band corrected. The process flow is then directed to step 64 where the previously described power level selection is invoked for the new band undergoing band correction.

As with the first band that was band corrected, all steps in FIG. 3 from 64 to 76 are repeated, with the band correction values for the current band and power levels being calculated and saved in another instance of Band Correction Data Table 176. The user interface 162 again prompts the user as to whether they desire to perform band correction on additional bands. If the user is finished, band correction terminates and process flow is directed to FIG. 4, where operational power measurements can now be performed, since the aforementioned calibration process for the Reference Band and band correction process for the non-Reference Bands are now complete.

It should be noted that the Reference Band and non-Reference Band calibration need to be done only once, and not each time one wishes to perform operational measurements with the meter, since the Reference Band Calibration Data Table 174 and the Band Correction Data Table 176 are saved in memory 171.

Measurements—Reference Band—Flowchart FIG. 4

The following describes the measurement processing functions on the Reference Band after calibration and any band corrections have been performed. Referring to FIG. 4, measurement processing commences at step 100. $ADC_M$, the ADC value for the incident power currently being processed, is acquired. Step 102 determines if measurements are being done on the Reference Band, which is information made available to the software by the user via the user interface 162 during normal operation of the meter.

If measurements are being performed on the Reference Band, step 104 determines if the current ADC value, $ADC_M$, is lower than the lowest calibration point acquired during the calibration procedure. This corresponds to the first available table entry in the Reference Band Calibration Data Table 174, in an implementation where the data are ordered from low value to high value, although other implementations are possible. In this case, the best match constant of proportionality, $K_M$ is set to $K_L$, as shown in step 106, where $K_L$ is the K value associated with the lowest available calibration point in Reference Band Calibration Data Table 174.

If the ADC value fails the low bound check described above, step 108 determines if the current ADC value, $ADC_M$, is higher than the highest calibration point acquired during Reference Band calibration. This corresponds to the last available table entry in the Reference Band Calibration Data Table 174. In this case, the best match constant of proportionality, $K_M$ is set to $K_H$ for the subsequent power calculation as shown in step 110, where $K_H$ is the K value associated with the highest available calibration point in Reference Band Calibration Data Table 174.

If neither of the above two cases apply, then $ADC_M$, must be bounded by two adjacent entries (rows) in the Reference Band Calibration Data Table 174. In this case, the software traverses the ADC column of Reference Band Calibration Data Table 174 until the two ADC values that bound $ADC_M$ are found. We refer to the two bounding ADC values as $ADC_L$, and $ADC_H$, where $ADC_L$ is the lower of the two values bounding $ADC_M$ and $ADC_H$, is the higher of the two values bounding $ADC_M$. $ADC_L$ and $ADC_H$ each have their own constants of proportionality, or K values associated them, namely $K_L$ and $K_H$ respectively, that each share a corresponding row in the Reference Band Calibration Data Table 174. The constant of proportionality, K, is determined by making use of the well known square law voltage to power relationship for an ideal coupler:

Power=$K$*(Voltage)$^2$ or in the case of an implementation such as this invention, which uses ADC values, which are directly proportional to the DC voltages generated by the coupler:

$$Power=K*(ADC\ value)^2$$

These $K_L$ and $K_H$ values are used to calculate a new K value that is a better representation of the coupler transfer function at the incident power level being measured than either $K_L$ or $K_H$. This calculation of the optimized K value is shown in step 112 and is repeated below.

$$K_M = K_L + [(ADC_M - ADC_L)/(ADC_H - ADC_L)]*(K_H - K_L)$$

Once this optimized K value is calculated, a high accuracy power calculation is performed using this K value as shown in step 114. This calculation, the ADC value squared multiplied by constant of proportionality, is simply an expression of the well known square law power relationship between the incident power being measured and the voltage generated by the Bruene-type coupler 154, but with the constant of proportionality, $K_M$, having been optimized using the novel calibration scheme unique to this invention.

The calculated measurement is then displayed to the user as shown in step 118 making use of the user interface 162. Program flow then proceeds back to step 100 where subsequent measurements are processed in an identical fashion.

Figure 5:
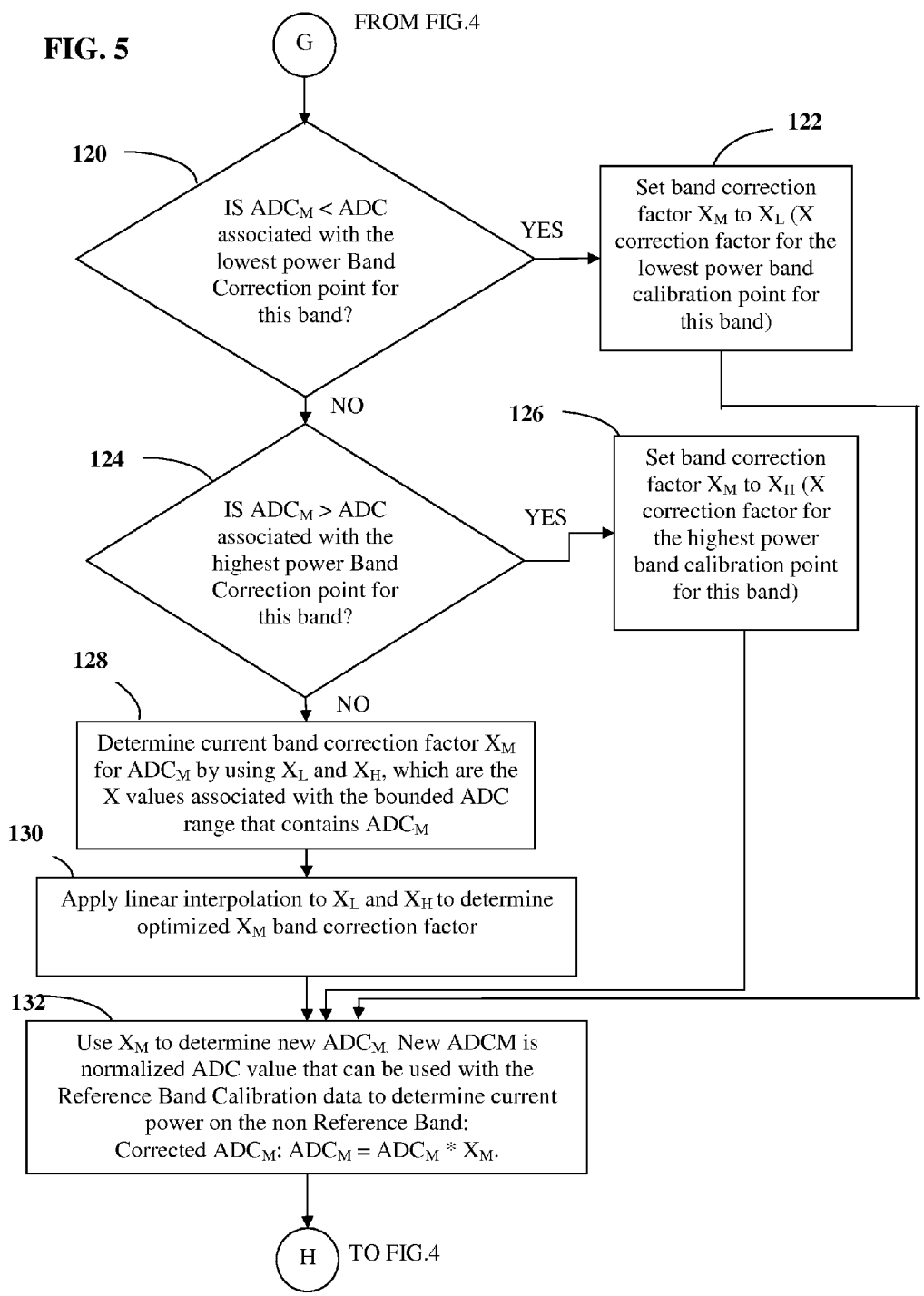
FIG. 5 shows a flowchart of a method of Measurement Processing according to the invention, when band correction is used.

Measurements on Bands Other than the Reference Band—FIG. 5

This section describes processing of measurements performed on the non-Reference Bands. Referring to FIG. 4, after ADC value $ADC_M$ is acquired in step 100. Since this is a non-Reference Band measurement, step 102 directs program flow to step 120 in FIG. 5.

Assume that the measured ADC value is exactly one of the ADC values in Band Correction Data Table 176 in FIG. 7. As can be seen from the band correction method used to create the band correction factors in the Band Correction Data Table 176, the approach used was to acquire an ADC measurement on the non Reference Band, and to normalize that ADC value, using a the band correction factor, to an ADC value that could be referenced to the ADC values in the Reference Band Calibration Data Table 174, thereby allowing the normalized ADC value to be used directly by the Reference Band Measurement algorithm described in FIG. 4. In effect, we have transformed the ADC measurement on the non-Reference Band to its equivalent Reference Band ADC value. We therefore always use the Reference Band calibration data to arrive at the actual power measurement, but only after "normalizing" the ADC value acquired on a non-Reference Band to its Reference Band value.

To determine the equivalent Reference Band ADC value when performing a non-Reference Band measurement, we multiply the ADC value acquired on the non-Reference Band by a band correction factor X to arrive at the ADC value of the corrected measurement, which is then normalized to the ADC values in the Reference Band Calibration Data Table 174.

If the ADC value, $ADC_M$, matches an entry exactly in the ADC column in the Band Correction Data Table 176, that ADC value can be corrected exactly to determine the normalized value. The equivalent Reference Band ADC value is computed as follows:

$$ADC_M = X*ADC_M$$

where the correction factor X is the corresponding correction factor for ADC value $ADC_M$ in the Band Correction Data Table 176, $ADC_M$ on the right hand side of the equation is the ADC value acquired while performing the power measurement on the non-Reference Band, and $ADC_M$ on the left hand side of the equation is normalized value that can now be processed using the Reference Band Calibration Data Table 174 as described in FIG. 4.

However, the probability of a non Reference Band measurement coinciding exactly with a discrete power correction point in Band Correction Data Table 176 is very low. If an exact match is not found, the correction factors of all available band correction factors (the X values) are consulted by the software. The generated ADC value produced by a coupler for any given non-Reference Band measurement will fall above or below the highest or lowest calibration entries in the Band Correction Data Table 176, or will fall between two adjacent entries, with each table entry (row) having its own band correction factor X, which has been calculated as described above.

Referring now to FIG. 5, step 120 determines if the current ADC value, $ADC_M$, is lower than the ADC value of lowest available band correction point acquired during the band correction calibration procedure shown in FIG. 3. This corresponds to the first available table entry in the Band Correction Data Table 176, in an implementation where the data are ordered from low value to high value, although other implementations are possible. If $ADC_M$ is indeed lower than the lowest table entry, the best match band correction factor, $X_M$ is set to the X value of the first available X value in the Band Correction Data Table 176, as shown in step 122. This is the band correction factor that will be used to process the current measurement.

If the ADC value fails the low bound check described above, step 124 in FIG. 5 determines if the current ADC value, $ADC_M$, is higher than the highest available band correction point. This corresponds to the last table entry in the Band Correction Data Table 176. If $ADC_M$ is indeed higher than the highest table entry, the best match band correction factor, $X_M$ is set to the X value of the last available X value in the Band Correction Data Table 176, as shown in step 126. This is the band correction factor that will be used to process the current measurement.

If neither the above lower bound check or upper bound check applies, then it follows that $ADC_M$ must be bounded by the ADC values of adjacent rows in the Band Correction Data Table 176. The measured value, $ADC_M$ is used to traverse the ADC column in the Band Correction Data Table 176 until the two ADC values that bound $ADC_M$ are found.

We refer to these as $ADC_L$, and $ADC_H$, where $ADC_L$ is the lower of the two values bounding $ADC_M$ and $ADC_H$, is the higher of the two values bounding $ADC_M$. Each of these entries has a band correction factor associated with them, namely $X_L$ and $X_H$ respectively. These X values are used to calculate a new X value that is a better representation of the band correction factor for the incident power being measured than either $X_L$ or $X_H$. These steps are shown in steps 128 and 130 in FIG. 5. The calculation of the optimized X value band correction factor using the two adjacent table entries is shown below.

$$X_M = X_L + [(ADC_M - ADC_L)/(ADC_H - ADC_L)]*(X_H - X_L)$$

Once the optimized X value is calculated as above, a new value of $ADC_M$ is calculated using the optimized band correction factor $X_M$, as shown in step 132 in FIG. 5. This new ADC value is a band corrected ADC value that can now be used directly by the Reference Band measurement process shown in FIG. 4.

Since the measured ADC value has been normalized to the ADC values in the Reference Band Calibration Data Table 174, program flow is redirected back to step 104 in FIG. 4, where processing continues using the Reference Band processing. Therefore, the only affect that band correction has during the measurement phase is to modify the actual measured $ADC_M$ value by multiplying it by the computed band correction factor, $X_M$. This results in an improvement in accuracy since the band correction factor is effectively correcting for any increase or decrease in sensitivity of the coupler transfer function as a result of that transfer function not being flat, or equal level, across all bands.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A power meter for use with a Bruene-type directional coupler having a voltage output proportional to a power level of a radio frequency signal passing through the coupler, the power meter comprising:
   a) a coupler input for accepting the voltage output of the Bruene-type directional coupler;
   b) an analog-to-digital converter having an analog input coupled to the coupler input and a digital output;
   c) a microprocessor having an input coupled to the digital output of the analog-to-digital converter, a plurality of outputs including at least a display output, and a memory, the memory comprising:
      i) a reference band calibration data table storing data pertaining to operation of the coupler on a selected reference band, comprising a plurality of power level values, a plurality of analog-to-digital converter values and a plurality of Kvalues, each analog-to-digital converter value and Kvalue being associated with one of the plurality of power levels; and
      ii) a plurality of band correction data tables, each band correction data table being associated with a frequency band and storing data pertaining to operation of the coupler on the frequency band, comprising a plurality of power level values, a plurality of analog-to-digital converter values and a plurality of Xvalues, each analog-to-digital converter value and Xvalue being associated with one of the plurality of power levels; and
   d) a display coupled to the display output of the microprocessor;
   e) the microprocessor being configured such that when a voltage from a Bruene-type directional coupler on the coupler input is converted to a measured digital value in the analog-to-digital converter, the microprocessor is programmed to:
      i) look up the measured digital value in the reference band calibration data table to select a Kvalue associated with an analog-to-digital converter value in the table corresponding to the measured digital value;
      ii) multiply the selected Kvalue by the measured digital value squared, giving a scaled power value; and
      iii) display the scaled power value on the display.

2. The power meter of claim 1, in which the microprocessor is programmed in (e)(i), if there is no analog-to-digital converter value in the reference band calibration data table equal to the measured digital value, using higher and lower analog-to-digital converter values in the reference band calibration data table to interpolate the selected Kvalue to a value between the Kvalues corresponding to the higher and lower analog-to-digital converter values in the reference band calibration data table.

3. The power meter of claim 2, wherein if the measured digital value is lower than the lowest analog-to-digital converter value in the reference band calibration data table, the Kvalue associated with the lowest analog-to-digital value in the reference band calibration data table is used, and if the measured digital value is higher than the highest available analog-to-digital converter value in the reference band calibration data table respectively, the Kvalue associated with the highest analog-to-digital value in the reference band calibration data table is used.

4. The power meter of claim 1, in which, if the radio frequency signal has a frequency in a frequency band other than a reference band, the microprocessor is programmed, before step (e)(i), to:
   look up the measured digital value in the band correction data table corresponding with the frequency band of the signal to select an Xvalue associated with an analog-to-digital converter value in the table corresponding to the measured digital value;
   multiply the measured digital value by the selected Xvalue, such that the measured digital value is corrected to account for differences in coupler characteristics between the frequency band of the signal and the reference band.

5. The power meter of claim 4, in which the microprocessor is programmed such that if there is no analog-to-digital converter value in the band correction data table equal to the measured digital value, using higher and lower analog-to-digital converter values in the band correction data table to interpolate the selected Xvalue to a value between the Xvalues corresponding to the higher and lower analog-to-digital converter values in the band correction data table.

6. The power meter of claim 5, wherein if the measured digital value is lower than the lowest analog-to-digital converter value in the reference band calibration data table, the Xvalue associated with the lowest analog-to-digital value in the reference band calibration data table is used, and if the measured digital value is higher than the highest available analog-to-digital converter value in the reference band calibration data table respectively, the Xvalue associated with the highest analog-to-digital value in the reference band calibration data table is used.

7. The power meter of claim 1, further comprising a scaling stage between the coupler input and the analog input of the analog-to-digital converter, comprising an amplifier having an adjustment input coupled to an output of the microprocessor, such that the microprocessor can control the amplifier to scale the voltage on the coupler input to a value which maximizes the resolution of the analog-to-digital converter.

8. The power meter of claim 1, in which the microprocessor is programmed to store data in the reference band calibration table by:
   a) accepting an entry of a power level and band of a radio frequency signal being generated on a reference band by a source and passing through the Bruene-type coupler and a precision measurement device to a known resistive load, the power level entered being measured by the precision measurement device;
   b) reading the measured digital value from the analog-to-digital converter;
   c) calculating a Kvalue equal to the power level divided by the measured digital value squared;
   d) storing the measured digital value, Kvalue, and power level in the reference band calibration table;

e) prompting the user to change the power to another power level; and f) repeating the process from step (a) until a selected number of power levels and corresponding measured digital values and Kvalues have been stored in the reference band calibration table.

9. The power meter of claim 1, in which the microprocessor is programmed to store data in a band correction data table by:
   a) accepting an entry from a user of a non-reference band of a radio frequency signal being generated on the non-reference band by a source and passing through the Bruene-type coupler and a precision measurement device to a known resistive load;
   b) prompting the user by displaying at least one power level chosen from the power levels stored in the reference band calibration table;
   c) accepting a confirmation from the user that the source has been set to generate the radio frequency at the displayed power level, the power level of the source being measured by the precision measurement device
   d) reading the measured digital value from the analog-to-digital converter;
   e) retrieving the analog-to-digital converter value from the reference band calibration table associated with the power level;
   f) calculating an Xvalue equal to the retrieved analog-to-digital converter value from the reference band calibration divided by the measured digital value;
   g) storing the measured digital value, Xvalue, and power level in the band correction data table;
   f) repeating the process from step (b) until a selected number of power levels and corresponding measured digital values and Xvalues have been stored in the band correction data table.

10. A method of measuring RF power using a power meter and a Bruene-type directional coupler having a voltage output proportional to a power level of a radio frequency signal passing through the coupler, the power meter comprising a coupler input for accepting the voltage output of the Bruene-type directional coupler; an analog-to-digital converter having an analog input coupled to the coupler input and a digital output; a microprocessor having an input coupled to the digital output of the analog-to-digital converter, a plurality of outputs including at least a display output, and a memory, the memory comprising a reference band calibration data table storing data pertaining to operation of the coupler on a selected reference band, comprising a plurality of power level values, a plurality of analog-to-digital converter values and a plurality of Kvalues, each analog-to-digital converter value and Kvalue being associated with one of the plurality of power levels; and a plurality of band correction data tables, each band correction data table being associated with a frequency band and storing data pertaining to operation of the coupler on the frequency band, comprising a plurality of power level values, a plurality of analog-to-digital converter values and a plurality of Xvalues, each analog-to-digital converter value and Xvalue being associated with one of the plurality of power levels; and a display coupled to the display output of the microprocessor; the method comprising the steps of:
   a) an RF source supplying a radio frequency signal to a load through the Bruene-type coupler;
   b) the microprocessor looking up the measured digital value in the reference band calibration data table to select a Kvalue associated with an analog-to-digital converter value in the table corresponding to the measured digital value;
   c) the microprocessor multiplying the selected Kvalue by the measured digital value squared, giving a scaled power value; and
   d) the microprocessor driving the display output to display the scaled power value on the display.

11. The method of claim 10, in which in step (b) if there is no analog-to-digital converter value in the reference band calibration data table equal to the measured digital value, using higher and lower analog-to-digital converter values in the reference band calibration data table to interpolate the selected Kvalue to a value between the Kvalues corresponding to the higher and lower analog-to-digital converter values in the reference band calibration data table.

12. The method of claim 11, wherein if the measured digital value is lower than the lowest analog-to-digital converter value in the reference band calibration data table, the Kvalue associated with the lowest analog-to-digital value in the reference band calibration data table is used, and if the measured digital value is higher than the highest available analog-to-digital converter value in the reference band calibration data table respectively, the Kvalue associated with the highest analog-to-digital value in the reference band calibration data table is used.

13. The method of claim 10, further comprising the steps, before step (b) of:
   i) the microprocessor determining if the radio frequency signal has a frequency in a frequency band other than a reference band:
   ii) if the radio frequency signal does have a frequency in a frequency band other than a reference band, then:
      A) the microprocessor looking up the measured digital value in the band correction data table corresponding with the frequency band of the signal to select an Xvalue associated with an analog-to-digital converter value in the table corresponding to the measured digital value; and
      B) the microprocessor multiplying the measured digital value by the selected Xvalue, such that the measured digital value is corrected to account for differences in coupler characteristics between the frequency band of the signal and the reference band.

14. The method of claim 13, in which in step (ii)(A), if there is no analog-to-digital converter value in the band correction data table equal to the measured digital value, using higher and lower analog-to-digital converter values in the band correction data table to interpolate the selected Xvalue to a value between the Xvalues corresponding to the higher and lower analog-to-digital converter values in the band correction data table.

15. The method of claim 14, wherein if the measured digital value is lower than the lowest analog-to-digital converter value in the reference band calibration data table, the Xvalue associated with the lowest analog-to-digital value in the reference band calibration data table is used, and if the measured digital value is higher than the highest available analog-to-digital converter value in the reference band calibration data table respectively, the Xvalue associated with the highest analog-to-digital value in the reference band calibration data table is used.

16. The method of claim 10, further comprising calibrating the power meter on a reference band by storing data in the reference band calibration table by the steps of:
   a) the microprocessor accepting an entry of a power level and band of a radio frequency signal being generated on a reference band by a source and passing through the Bruene-type coupler and a precision measurement device to a known resistive load, the power level entered being measured by the precision measurement device;

b) the microprocessor reading the measured digital value from the analog-to-digital converter;

c) the microprocessor calculating a Kvalue equal to the power level divided by the measured digital value squared;

d) the microprocessor storing the measured digital value, Kvalue, and power level in the reference band calibration table;

e) the microprocessor prompting the user to change the power to another power level; and f) repeating the process from step (a) until a selected number of power levels and corresponding measured digital values and Kvalues have been stored in the reference band calibration table.

17. The method of claim 10, in which the power meter further comprises a scaling stage comprising an adjustable DC amplifier between the coupler input and the analog input of the analog-to-digital converter, the adjustable DC amplifier having an adjustment input coupled to an output of the microprocessor, and the method further comprises the step of the microprocessor adjusting the DC amplifier through the adjustment input to set the maximum voltage delivered to the analog input of the analog-to-digital converter to a value such that a maximum resolution of the analog-to-digital converter is realized.

18. The method of claim 10, further comprising correcting the power meter for readings on a non-reference band by storing data in a band correction data table by:

a) the microprocessor accepting an entry from a user of a non-reference band of a radio frequency signal being generated on the non-reference band by a source and passing through the Bruene-type coupler and a precision measurement device to a known resistive load;

b) the microprocessor prompting the user by displaying at least one power level chosen from the power levels stored in the reference band calibration table;

c) the microprocessor accepting a confirmation from the user that the source has been set to generate the radio frequency at the displayed power level, the power level of the source being measured by the precision measurement device d) the microprocessor reading the measured digital value from the analog-to-digital converter;

e) the microprocessor retrieving the analog-to-digital converter value from the reference band calibration table associated with the power level;

f) the microprocessor calculating an Xvalue equal to the retrieved analog-to-digital converter value from the reference band calibration divided by the measured digital value;

g) the microprocessor storing the measured digital value, Xvalue, and power level in the band correction data table;

f) repeating the process from step (b) until a selected number of power levels and corresponding measured digital values and Xvalues have been stored in the band correction data table.

19. The method of claim 18, further comprising repeating the method from step (a) for other non-reference bands.

* * * * *